(12) United States Patent    (10) Patent No.:    US 12,690,142 B2

You et al.    (45) Date of Patent:     Jul. 21, 2026

(54) PRINTED CIRCUIT BOARD AND METHOD FOR MANUFACTURING THE SAME

(71) Applicant: SAMSUNG ELECTRO-MECHANICS CO., LTD., Suwon-si (KR)

(72) Inventors: Ki Hwan You, Suwon-si (KR); Seung Ju Lee, Suwon-si (KR); Tae Hun Kim, Suwon-si (KR); Chang Gon Kim, Suwon-si (KR); Yeon Ji Kim, Suwon-si (KR); Young Gon Kim, Suwon-si (KR); Ho Kwon Yoon, Suwon-si (KR); Eun Seok Kang, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 454 days.

(21) Appl. No.: 17/991,627

(22) Filed: Nov. 21, 2022

(65) Prior Publication Data

US 2023/0189451 A1    Jun. 15, 2023

(30) Foreign Application Priority Data

Dec. 14, 2021    (KR) ........................ 10-2021-0179018

(51) Int. Cl.
| | |
|---|---|
| *H05K 3/46* | (2006.01) |
| *H05K 1/02* | (2006.01) |
| *H10W 20/00* | (2026.01) |

(52) U.S. Cl.
CPC ......... *H05K 3/4688* (2013.01); *H05K 1/0298* (2013.01); *H10W 20/083* (2026.01)

(58) Field of Classification Search
CPC .. H05K 3/4688; H05K 1/0298; H05K 1/0206; H05K 1/0209; H05K 1/111;
(Continued)

(56) References Cited

U.S. PATENT DOCUMENTS

| | | | |
|---|---|---|---|
| 2003/0027942 A1* | 2/2003 | Oota ..................... | C08F 283/06 |
| | | | 525/461 |
| 2013/0048345 A1 | 2/2013 | Masuda et al. | |

(Continued)

FOREIGN PATENT DOCUMENTS

| | | |
|---|---|---|
| JP | 2013-65810 A | 4/2013 |
| KR | 10-2026197 B1 | 9/2019 |

(Continued)

OTHER PUBLICATIONS

Korean Office Action dated Aug. 20, 2025 issued in Korean Patent Application No. 10-2021-0179018 (with English translation).

*Primary Examiner* — Timothy J Thompson

(74) *Attorney, Agent, or Firm* — Morgan Lewis & Bockius LLP

(57) ABSTRACT

A printed circuit board includes: a first insulating layer; a first circuit layer disposed on one surface of the first insulating layer and including a connection pad; a second insulating layer disposed on the one surface of the first insulating layer and embedding the first circuit layer; a via penetrating through the second insulating layer and connected to the first circuit layer; a metal post disposed on one surface of the second insulating layer and connected to the via; and a hole penetrating through the second insulating layer and exposing at least a portion of the connection pad of the first circuit layer. The metal post is spaced apart from the hole, and protrudes from the second insulating layer.

21 Claims, 14 Drawing Sheets

(58) Field of Classification Search
CPC ................. H05K 1/181; H05K 3/4644; H05K
2201/09472; H05K 1/0204; H05K
1/0256; H05K 1/0296; H05K 1/115;
H05K 3/0082; H05K 2201/096; H01L
21/76805
USPC ......................................................... 174/260
See application file for complete search history.

(56) References Cited

U.S. PATENT DOCUMENTS

| | | | | |
|---|---|---|---|---|
| 2016/0315042 | A1* | 10/2016 | Yoon ...................... | H01L 21/288 |
| 2016/0351506 | A1* | 12/2016 | Kim ..................... | H01L 21/4853 |
| 2016/0374196 | A1* | 12/2016 | Lee ...................... | H05K 3/4697 |
| 2017/0213799 | A1* | 7/2017 | Inagaki ................... | H01L 24/19 |
| 2023/0105635 | A1* | 4/2023 | Otsubo .................. | H05K 1/113 |
| | | | | 174/260 |

FOREIGN PATENT DOCUMENTS

| | | | |
|---|---|---|---|
| KR | 10-2020-0017729 | A | 2/2020 |
| KR | 10-2021-0024870 | A | 3/2021 |
| WO | 2013/036026 | A2 | 3/2013 |

* cited by examiner

10A

110

100

110
200

100

PRINTED CIRCUIT BOARD AND METHOD FOR MANUFACTURING THE SAME

CROSS-REFERENCE TO RELATED APPLICATION(S)

This application claims benefit of priority to Korean Patent Application No. 10-2021-0179018 filed on Dec. 14, 2021 in the Korean Intellectual Property Office, the disclosure of which is incorporated herein by reference in its entirety.

TECHNICAL FIELD

The present disclosure relates to a printed circuit board and a method for manufacturing the same.

BACKGROUND

Concomitant with development of semiconductors and electronic devices, a printed circuit board has taken up a firm position as one of electronic components, and widely used as a component realizing a circuit for all electric and electronic devices from various electric and electronic products such as radios, televisions, and PCSs to computers and high-tech electronic equipment.

The printed circuit board includes an insulating layer such as a polyimide film, and a surface of the insulating layer is protected by a protective layer such as a solder resist. In addition, various electronic components may be mounted on the printed circuit board.

In order to follow the recent trend of mobile devices towards weight reduction and size reduction, there has also been a growing need for making a printed circuit board mounted thereon lighter, thinner, shorter, and smaller.

In particular, according to the decrease in thickness of the printed circuit board, methods of effectively dissipating heat generated by a semiconductor chip have been continuously discussed.

SUMMARY

An aspect of the present disclosure may provide a printed circuit board including a fine circuit and/or a fine via.

Another aspect of the present disclosure may provide a printed circuit board capable of effectively releasing heat generated by an electronic component.

According to an aspect of the present disclosure, a printed circuit board may include: a first insulating layer; a first circuit layer disposed on one surface of the first insulating layer and including a connection pad; a second insulating layer disposed on the one surface of the first insulating layer and embedding the first circuit layer; a via penetrating through the second insulating layer and connected to the first circuit layer; a metal post disposed on one surface of the second insulating layer and connected to the via; and a hole penetrating through the second insulating layer and exposing at least a portion of the connection pad of the first circuit layer. The metal post may be spaced apart from the hole, and protrude from the second insulating layer.

According to another aspect of the present disclosure, a printed circuit board may include: a first insulating layer; a first circuit layer disposed on one surface of the first insulating layer and including a connection pad; a second insulating layer disposed on the one surface of the first insulating layer and embedding the first circuit layer; a via penetrating through the second insulating layer and connected to the first circuit layer; a metal post connected to the via and protruding from the second insulating layer; a hole penetrating through the second insulating layer and spaced apart from the metal post; a bump disposed in the hole and connected to the connection pad of the first circuit layer; and an electronic component having one surface connected to each of the metal post and the bump.

According to another aspect of the present disclosure, a method for manufacturing a printed circuit board may include forming a first circuit layer on one surface of a first insulating layer; stacking a second insulating layer on the one surface of the first insulating layer; forming a plurality of via holes penetrating through the second insulating layer; forming vias filling some of the plurality of via holes; disposing a photosensitive material on one surface of the second insulating layer and forming an opening in the photosensitive material to expose at least a portion of one surface of each of the vias; forming a metal post by disposing an electroless plating layer and an electrolytic plating layer on the exposed portion of the one surface of the via; and removing the photosensitive material.

According to another aspect of the present disclosure, a printed circuit board may include: an insulating body; a circuit layer embedded in the insulating body and including a connection pad; a metal post protruding from the insulating body; and a hole penetrating in a region of the insulating body surrounded by the metal post to expose a portion of the connection pad.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
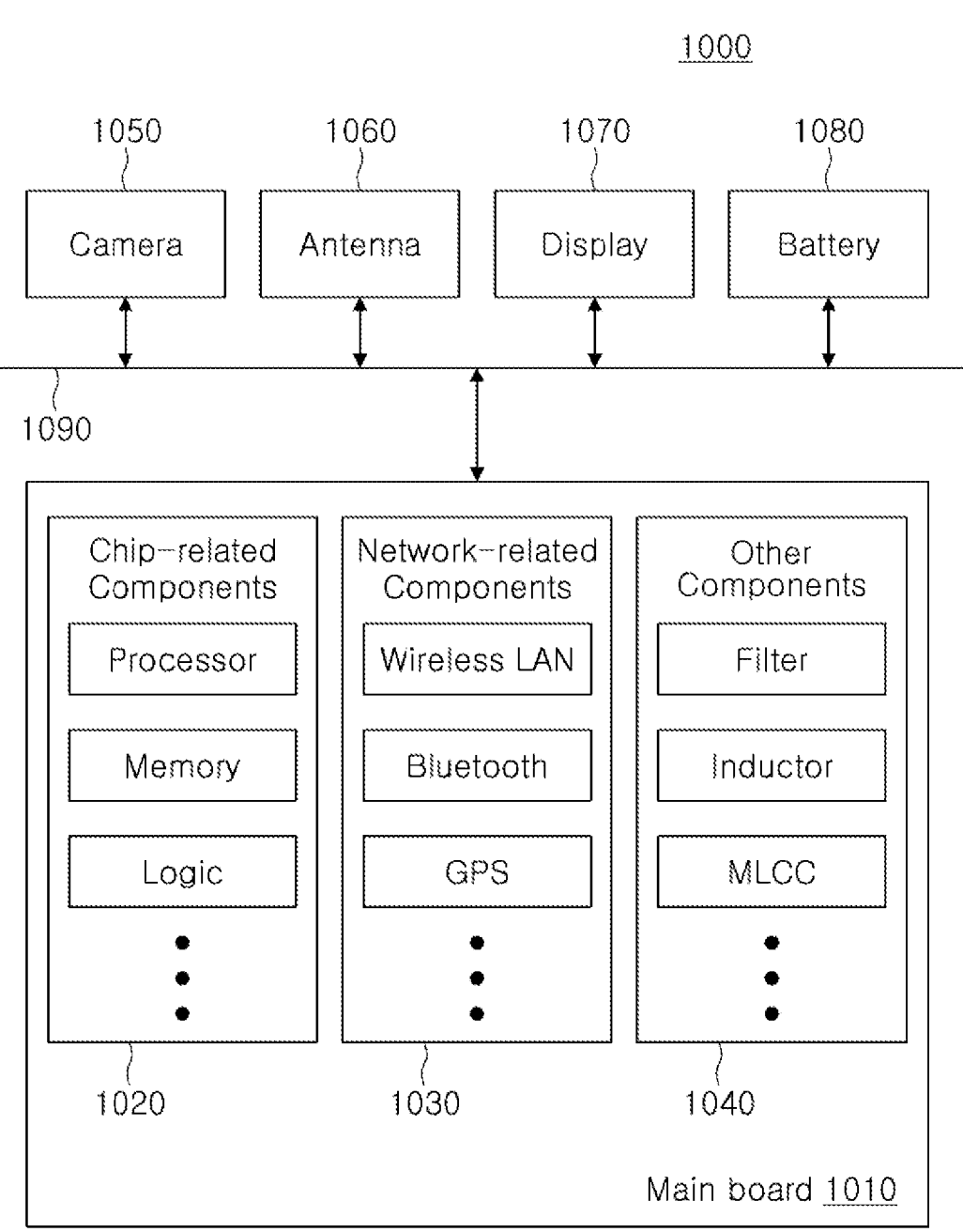
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto.

These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, these electronic components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related electronic components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related electronic components 1020 and/or the network-related electronic components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
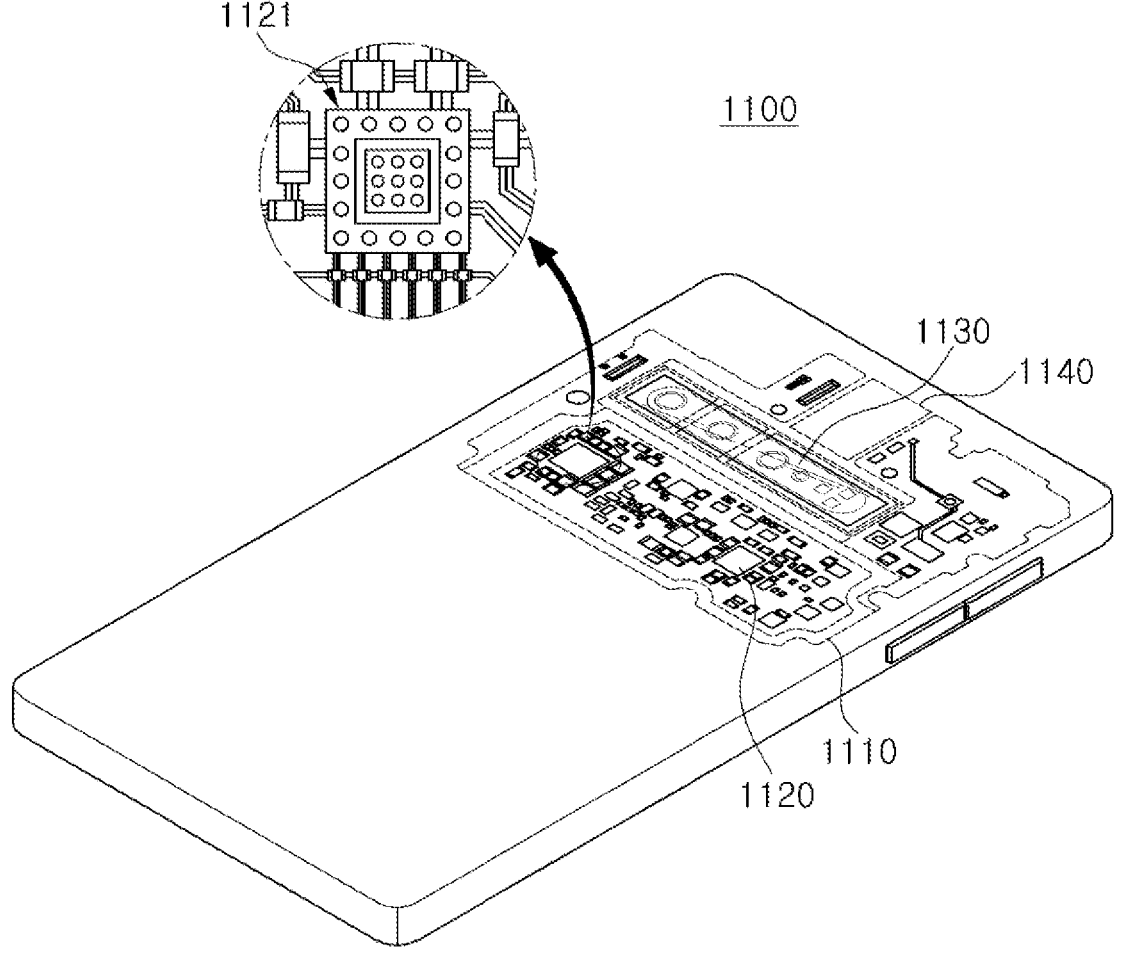
FIG. 2 is a schematic view illustrating an exemplary embodiment of an electronic device.

FIG. 2 is a schematic perspective view illustrating an exemplary embodiment of an electronic device.

Referring to FIG. 2, the electronic device may be, for example, a smartphone 1100. A mainboard 1110 may be accommodated in the smartphone 1100, and various electronic components 1120 may be physically and/or electrically connected to the mainboard 1110. In addition, other electronic components that may or may not be physically and/or electrically connected to the mainboard 1110, such as a camera module 1130 and/or a speaker 1140, may also be accommodated therein. Some of the electronic components 1120 may be the above-described chip-related components, e.g., an antenna module 1121, but are not limited thereto. The antenna module 1121 may be in such a form that the electronic component is surface-mounted on a printed circuit board, but is not limited thereto. Meanwhile, the electronic device is not necessarily limited to the smartphone 1100, but may be any other electronic device as described above.

Printed Circuit Board

Figure 3:
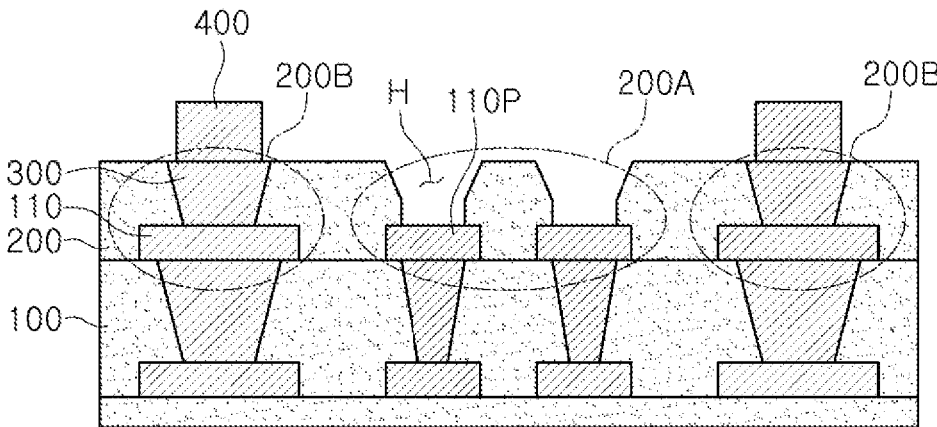
FIG. 3 is a schematic view illustrating a printed circuit board according to an exemplary embodiment of the present disclosure.

FIG. 3 is a schematic view illustrating a printed circuit board 10A according to an exemplary embodiment of the present disclosure.

Figure 4:
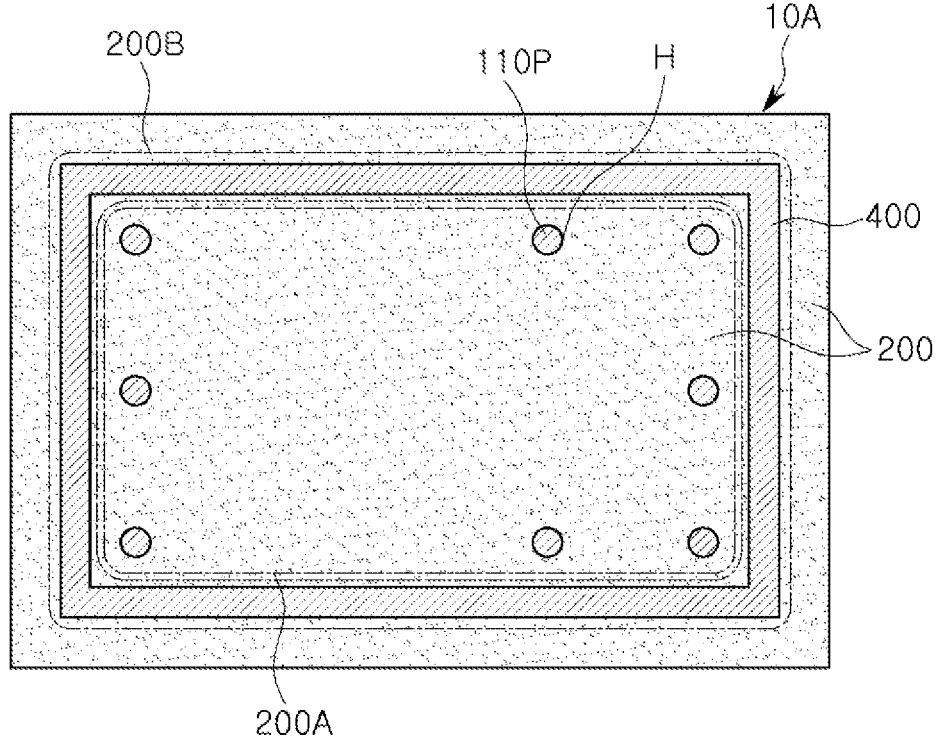
FIG. 4 is a schematic view illustrating a printed circuit board according to an exemplary embodiment of the present disclosure.

FIG. 4 is a schematic view illustrating a printed circuit board 10A according to an exemplary embodiment of the present disclosure. FIG. 4 is a plan view of the printed circuit board 10A of FIG. 3 when viewed above.

Referring to FIG. 3, the printed circuit board 10A according to the present disclosure may include: a first insulating layer 100; a first circuit layer 110 disposed on one surface of the first insulating layer 100 and including a connection pad 110P; a second insulating layer 200 disposed on one surface of the first insulating layer 100 and embedding the first circuit layer 110; a via 300 penetrating through the second insulating layer 200 and connected to the first circuit layer 110; a metal post 400 disposed on one surface of the second insulating layer 200 and connected to the via 300; and a hole H penetrating through the second insulating layer 200 and exposing at least a portion of the connection pad 110P of the first circuit layer 110.

In this case, the metal post 400 may be spaced apart from the hole H, and may protrude from the second insulating layer 200. More specifically, a plurality of holes including via holes may be formed in the second insulating layer 200. In this case, some holes may be filled with vias, and each of the other holes H, which are not filled with vias, may expose the connection pad 110P of the first circuit layer 110. In addition, the metal post 400 may be formed on one surface of the via 300 to protrude from each of the second insulating layer 200 and the via 300, but is not limited thereto.

The second insulating layer 200 of the printed circuit board 10A according to the present disclosure may include a central portion 200A and a peripheral portion 200B. A region other than the peripheral portion 200B formed along an outer surface of the printed circuit board 10A may correspond to the central portion 200A, but is not limited thereto.

In this case, the metal post 400, which may have a frame structure, may be disposed on the peripheral portion 200B of the second insulating layer 200, and in particular, may be disposed to surround four surfaces of the peripheral portion 200B of the second insulating layer, but is not limited thereto. For a specific structure, FIG. 3 may be referred to, and a region in which the metal post 400 is disposed may correspond to the peripheral portion 200B of the second insulating layer 200. In one example, the metal post 400 may continuously extend along the peripheral portion 200B to have a loop structure, although the present disclosure is not limited thereto.

In addition, the hole H may be disposed in the central portion 200A of the second insulating layer 200. The central portion 200A of the second insulating layer 200 may correspond to an inner region other than the peripheral portion 200B, and a region in which the hole H, to which at least a portion of the connection pad 110P of the first circuit layer 110 is exposed, is disposed may correspond to the central portion 200A of the second insulating layer 200, but the central portion 200A is not limited thereto.

In addition, a plurality of holes H, each exposing at least a portion of the connection pad 110P of the first circuit layer 110, may be arranged. In this case, the metal post 400 disposed on the peripheral portion 200B of the second insulating layer 200 may be disposed to surround the plurality of holes H in the central portion 200A of the second insulating layer 200. That is, the peripheral portion 200B of the second insulating layer 200 may be disposed to surround the central portion 200A, but is not limited thereto.

In the printed circuit board 10A according to the present disclosure, at least a portion of the via 300 and at least a portion of the metal post 400 may be in contact with each other, and the via 300 may have a largest diameter or cross-sectional area in a region or on a plane contacting the metal post 400. That is, the via 300 may be tapered in a direction farther away from the metal post 400, but is not limited thereto. In addition, the metal post 400 may have a cross-sectional area or diameter smaller than the largest value of the cross-sectional area or diameter of the via 300.

Alternatively, although not illustrated, the metal post 400 may have a cross-sectional area or diameter larger than the largest value of the cross-sectional area or diameter of the via 300. More specifically, the metal post 400 disposed on one surface of the via 300 may entirely cover the one surface of the via 300, but is not limited thereto.

Figure 6A:
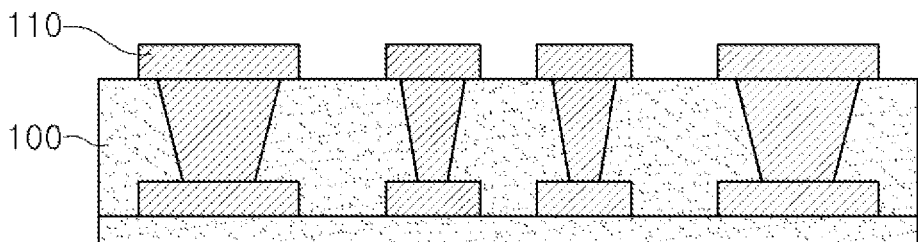
FIGS. 6A to 6I are schematic views illustrating a method for manufacturing a printed circuit board according to an exemplary embodiment of the present disclosure.
Figure 6B:
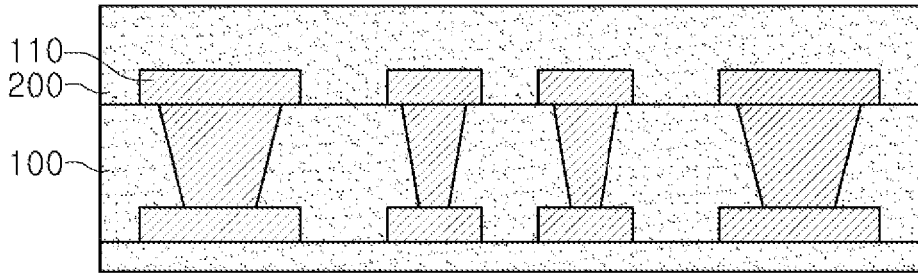
Figure 6C:
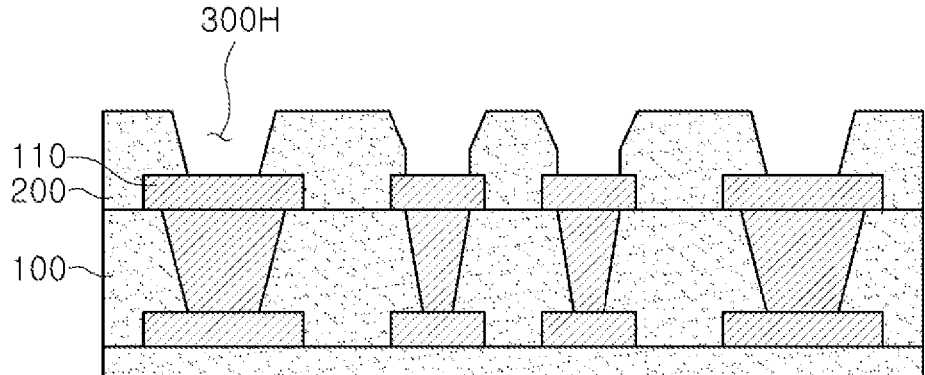
Figure 6D:
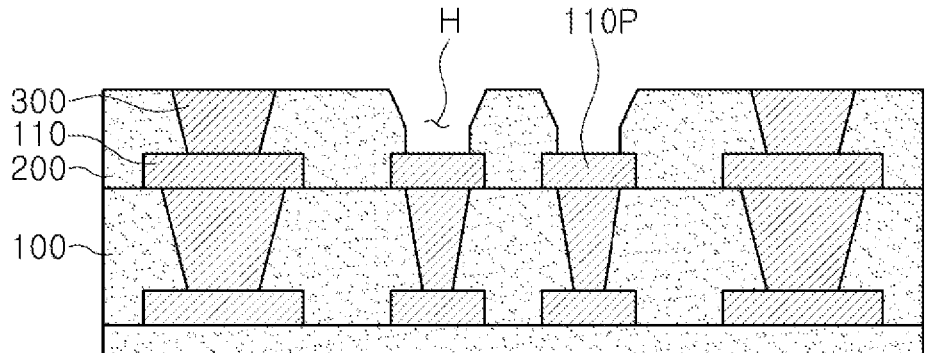
Figure 6E:
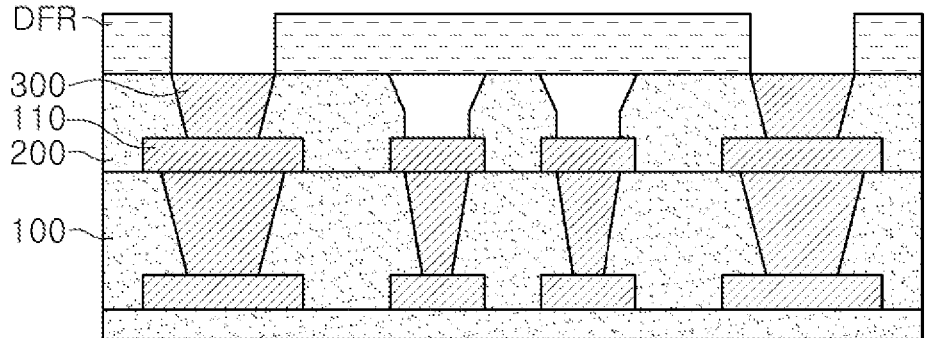
Figure 6F:
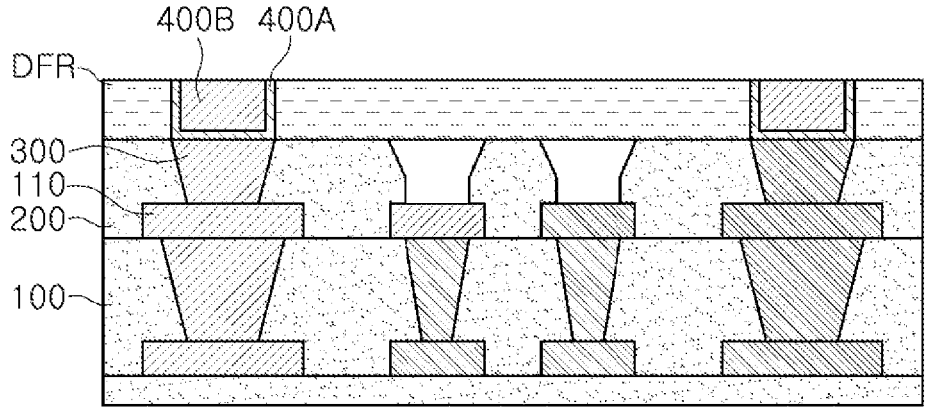

The metal post 400 of the printed circuit board 10A according to the present disclosure may include an electroless plating layer 400A (shown in FIG. 6F) and an electrolytic plating layer 400B (shown in FIG. 6F). In this case, the electroless plating layer 400A may be disposed only in a region adjacent to the via 300, and the electrolytic plating layer 400B may be disposed to be spaced apart from the via 300, but the electroless plating layer 400A and the electrolytic plating layer 400B are not limited thereto.

In this way, since the metal post 400 is connected in contact with an electronic component to be described below, heat generated by the electronic component can be effectively released externally, and a distance between the electronic component and the printed circuit board 10A can be reduced, thereby making it possible to manufacture a thin printed circuit board.

The first and second insulating layers 100 and 200 of the printed circuit board 10A according to the present disclosure may include a known insulating material and provide as an insulating body, but are not limited thereto. More specifically, the first and second insulating layers 100 and 200 may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

In addition, each of the first circuit layer 110 and the via 300 may be formed using a conductive material such as copper (Cu), aluminum (Al), silver (Ag), tin (Sn), gold (Au), nickel (Ni), lead (Pb), titanium (Ti), palladium (Pd), or an alloy thereof, but is not limited thereto.

In addition, each of the first circuit layer 110 and the via 300 of the printed circuit board 10A according to the present disclosure may include an electroless plating layer and an electrolytic plating layer. The electroless plating layer may serve as a seed layer for the electrolytic plating layer, but is not limited thereto.

In this case, the electroless plating layer and the electrolytic plating layer filling each of the first circuit layer 110 and the via 300 may also include copper (Cu), aluminum (Al), silver (Ag), tin (Sn), gold (Au), nickel (Ni), lead (Pb), titanium (Ti), palladium (Pd), or an alloy thereof.

In an outermost one of the first circuit layers 110 of the printed circuit board 10A according to the present disclosure, the connection pad 110P exposed by the hole H may include a surface treatment layer, and the surface treatment layer may include a different composition from each of the first circuit layers 110. For example, each of the circuit layers 110 may include copper (Cu), and the surface treatment layer may include nickel (Ni) or tin (Sn), but the circuit layer and the surface treatment layer are not limited thereto.

In addition, the second insulating layer 200 of the printed circuit board 10A according to the present disclosure may be a solder resist layer covering at least a portion of the first circuit layer 110 including the surface treatment layer. The solder resist may have thermosetting and/or photocurable properties, but is not limited thereto.

Concerning the other components, what has been described above is substantially identically applicable, and thus, the detailed description thereof will not be repeated.

Figure 5:
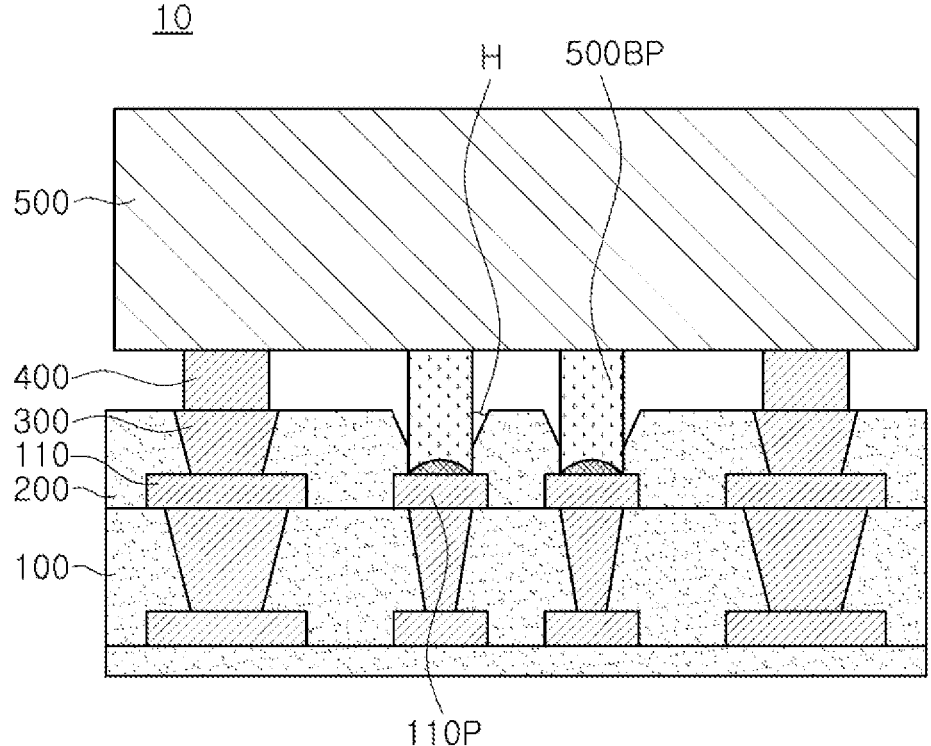
FIG. 5 is a schematic view illustrating a printed circuit board according to an exemplary embodiment of the present disclosure.

FIG. 5 is a schematic view illustrating a printed circuit board 10 according to an exemplary embodiment of the present disclosure.

Referring to FIG. 5, the printed circuit board 10 according to the present disclosure may include: a first insulating layer 100; a first circuit layer 110 disposed on one surface of the first insulating layer 100 and including a connection pad 110P; a second insulating layer 200 disposed on one surface of the first insulating layer 100 and embedding the first circuit layer 110; a via 300 penetrating through the second insulating layer 200 and connected to the first circuit layer 110; a metal post 400 connected to the via 300 and protruding from the second insulating layer 200; a hole H penetrating through the second insulating layer and spaced apart from the metal post 400; a bump 500BP disposed in the hole H and connected to the connection pad 110P of the first circuit layer 110; and an electronic component 500 whose one surface is connected to each of the metal post 400 and the bump 500BP. In one example, at least a portion of a wall of the hole H may be spaced apart from the bump 500BP disposed in the hole H.

In this case, a plurality of holes including via holes may be formed in the second insulating layer 200. Some holes may be filled with vias, and each of the other holes H, which are not filled with vias, may expose the connection pad 110P of the first circuit layer 110. In addition, the metal post 400 may be formed on one surface of the via 300 to protrude from each of the second insulating layer 200 and the via 300, but is not limited thereto.

The second insulating layer 200 of the printed circuit board 10 according to the present disclosure may include a central portion 200A (shown in FIGS. 3 and 4) and a peripheral portion 200B (shown in FIGS. 3 and 4). A region other than the peripheral portion 200B formed along an outer surface of the printed circuit board 10 may correspond to the central portion 200A, but is not limited thereto. In addition, the electronic component 500 of the printed circuit board 10 according to the present disclosure may also include a central portion and a peripheral portion.

In this case, the metal post 400 may be disposed on the peripheral portion 200B of the second insulating layer 200, and in particular, may be disposed to surround four surfaces of the peripheral portion 200B of the second insulating layer, but is not limited thereto. For a specific structure, FIG. 3 may be referred to, and a region in which the metal post 400 is disposed may correspond to the peripheral portion 200B of the second insulating layer 200. Also, the metal post 400 may be disposed on the peripheral portion of the electronic component 500. That is, a component disposed outermost among metal components connected to the electronic component 500 may correspond to the metal post 400, but is not limited thereto.

Also, the bump 500BP may be disposed on the central portion 200A of the second insulating layer 200. The central portion 200A of the second insulating layer 200 may correspond to an inner region other than the peripheral portion 200B, and a region in which the bump 500BP, to which at least a portion of the connection pad 110P of the first circuit layer 110 is exposed, is disposed may correspond to the central portion 200A of the second insulating layer 200, but the central portion 200A is not limited thereto. In addition, the bump 500BP may also be disposed on a central portion of the electronic component 500. In this case, a region in which the bump 500BP is disposed may correspond to the central portion of the electronic component 500, but is not limited thereto.

In addition, a plurality of bumps 500BP, each connected to the connection pad 110P of the first circuit layer 110, may be arranged. In this case, the metal post 400 may be disposed to surround the bumps 500BP. That is, the peripheral portion of the electronic component 500 may be disposed to surround the central portion of the electronic component 500, but is not limited thereto.

In this way, since the electronic component 500 is connected in contact with the metal post 400, heat generated by the electronic component 500 can be effectively released externally, and a distance between the electronic component 500 and the printed circuit board 10 can be reduced, thereby making it possible to manufacture a thin printed circuit board.

In addition, the metal post 400 of the printed circuit board 10 according to the present disclosure may have a height of 15 to 45 μm. This is because, if the distance between the printed circuit board 10 and the electronic component 500 is too great, it may be difficult to manufacture a thin printed circuit board, and a signal transmission effect may also be reduced.

In the printed circuit board 10 according to the present disclosure, at least a portion of the via 300 and at least a portion of the metal post 400 may be in contact with each other, and the via 300 may have a largest diameter or cross-sectional area in a region or on a plane contacting the metal post 400. That is, the via 300 may be tapered in a direction farther away from the metal post 400, but is not limited thereto. In addition, the metal post 400 may have a cross-sectional area or diameter smaller than the largest value of the cross-sectional area or diameter of the via 300. In one example, in a direction crossing (e.g., perpendicular to) an extending direction of the metal post 400, the metal post 400 may have a smaller dimension such as a width than the largest dimension such as the largest width of the via 300.

Alternatively, although not illustrated, the metal post 400 may have a cross-sectional area or diameter larger than the largest value of the cross-sectional area or diameter of the via 300. In one example, in a direction crossing (e.g., perpendicular to) an extending direction of the metal post 400, the metal post 400 may have a greater dimension such as a width than the largest dimension such as the largest width of the via 300. More specifically, the metal post 400 disposed on one surface of the via 300 may entirely cover the one surface of the via 300, but is not limited thereto.

Figure 6G:
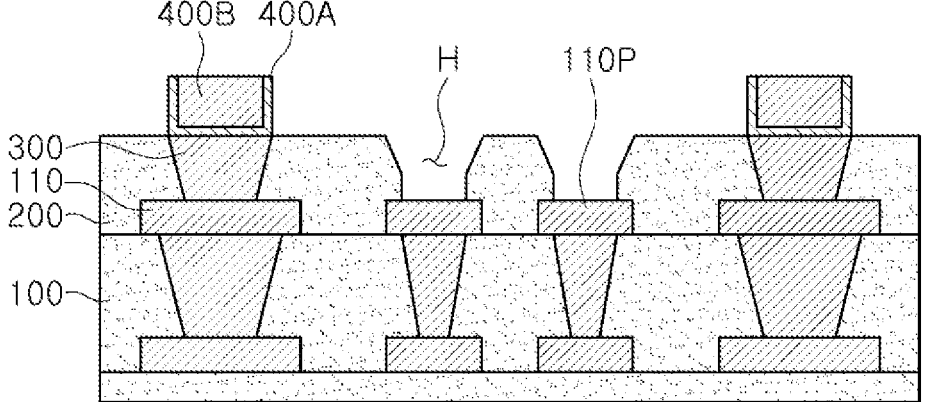

The metal post 400 of the printed circuit board 10 according to the present disclosure may include an electroless plating layer 400A (shown in FIG. 6G) and an electrolytic plating layer 400B (shown in FIG. 6G). In this case, the electroless plating layer 400A may only be disposed in a region adjacent to the via 300, and the electrolytic plating layer 400B may be disposed to be spaced apart from the via 300, but the electroless plating layer 400A and the electrolytic plating layer 400B are not limited thereto.

The first and second insulating layers 100 and 200 of the printed circuit board 10 according to the present disclosure may include a known insulating material, but are not limited thereto. More specifically, the first and second insulating layers 100 and 200 may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

In addition, each of the first circuit layer 110 and the via 300 may be formed using a conductive material such as copper (Cu), aluminum (Al), silver (Ag), tin (Sn), gold (Au), nickel (Ni), lead (Pb), titanium (Ti), palladium (Pd), or an alloy thereof, but is not limited thereto.

In addition, each of the first circuit layer 110 and the via 300 of the printed circuit board 10 according to the present disclosure may include an electroless plating layer and an electrolytic plating layer. The electroless plating layer may serve as a seed layer for the electrolytic plating layer, but is not limited thereto.

In this case, the electroless plating layer and the electrolytic plating layer filling each of the first circuit layer 110 and the via 300 may also include copper (Cu), aluminum (Al), silver (Ag), tin (Sn), gold (Au), nickel (Ni), lead (Pb), titanium (Ti), palladium (Pd), or an alloy thereof.

In an outermost one of the first circuit layers 110 of the printed circuit board 10 according to the present disclosure, the connection pad 110P exposed by the hole H may include a surface treatment layer, and the surface treatment layer may include a different composition from each of the first circuit layers 110. For example, each of the circuit layers 110 may include copper (Cu), and the surface treatment layer may include nickel (Ni) or tin (Sn), but the circuit layer and the surface treatment layer are not limited thereto.

In addition, the second insulating layer 200 of the printed circuit board 10 according to the present disclosure may be a solder resist layer covering at least a portion of the first circuit layer 110 including the surface treatment layer. The solder resist may have thermosetting and/or photocurable properties, but is not limited thereto.

Concerning the other components, what has been described above is substantially identically applicable, and thus, the detailed description thereof will not be repeated.

Method for Manufacturing Printed Circuit Board

FIGS. 6A to 6I are schematic views illustrating a method for manufacturing a printed circuit board 10 according to an exemplary embodiment of the present disclosure.

A method for manufacturing a printed circuit board 10 according to the present disclosure will be described below with reference to FIGS. 6A to 6I.

First, as illustrated in FIG. 6A, a first insulating layer 100 on which at least one circuit layer is formed may be prepared. In this case, the first circuit layer 110 may protrude from one surface of the first insulating layer 100, and a second circuit layer may be embedded in the other surface facing one surface of the first insulating layer 100, but the first insulating layer 100 is not limited thereto. In addition, a via connecting the first and second circuit layers to each other may be further included.

Thereafter, as illustrated in FIG. 6B, a second insulating layer 200 embedding the first circuit layer 110 may be disposed on one surface of the first insulating layer 100. In this case, the first and second insulating layers 100 and 200 may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

Thereafter, as illustrated in FIG. 6C, a via hole 300H exposing at least a portion of the first circuit layer 110 may be formed. In this case, the via hole 300H may be formed by a known method, and specifically, may be formed through laser drilling, CNC drilling, blasting, or the like, but is not limited thereto. In addition, a plurality of via holes 300H may be formed, and some of the via holes 300H may correspond to the above-described holes H. More specifically, a via 300 filling the via hole 300H may be formed as illustrated in FIG. 6D. In this case, only some of the plurality of the via holes 300H may be filled with the vias, and a region that is not filled with the via 300 may correspond to a component that is identical to the above-described hole H. That is, a via hole 300H that is not filled with the via 300 may expose a portion of the first circuit layer 110, and the exposed portion of the first circuit layer 110 may correspond to a component that is identical to a connection pad 110P connected to an electronic component to be described below, but is not limited thereto.

In particular, referring to FIG. 6D, the hole filled with the via 300 has a different diameter or shape from the hole that is not filled with the via 300. However, the hole that is filled with the via 300 and the hole that is not filled with the via 300 are not limited to what is illustrated in the drawings, and may have a similar shape or diameter if the via holes 300H are formed by the same method.

Thereafter, as illustrated in FIG. 6E, a photosensitive material DFR may be disposed on one surface of the second insulating layer 200. In this case, the photosensitive material DFR may expose at least a portion of one surface of the via 300, but is not limited thereto. In this case, the photosensitive material DFR may function as a mask at the time of forming an electroless plating layer 400A and an electrolytic plating layer 400B to be described below, but is not limited thereto.

Thereafter, as illustrated in FIG. 6F, the electroless plating layer 400A and the electrolytic plating layer 400B may be disposed in the exposed region of one surface of the via 300. Each of the electroless plating layer 400A and the electrolytic plating layer 400B may be formed by an electroless plating method and an electrolytic plating method, respectively, and the electroless plating layer 400A may function as a seed layer at the time of forming the electrolytic plating layer 400B, but is not limited thereto.

After forming a metal post 400 including the electroless plating layer 400A and the electrolytic plating layer 400B, the photosensitive material DFR may be removed as illustrated in FIG. 6G. In a case where the photosensitive material DFR covers a portion of one surface of the via 300, the metal post 400 may have a smaller diameter or cross-sectional area than the via 300. In one example, in a direction crossing (e.g., perpendicular to) an extending direction of the metal post 400, the metal post 400 may have a smaller dimension such as a width than that of the via 300.

In addition, the diameter of the metal post 400 may be defined depending on an area in which the photosensitive material DFR is disposed, but is not limited thereto.

Figure 6H:
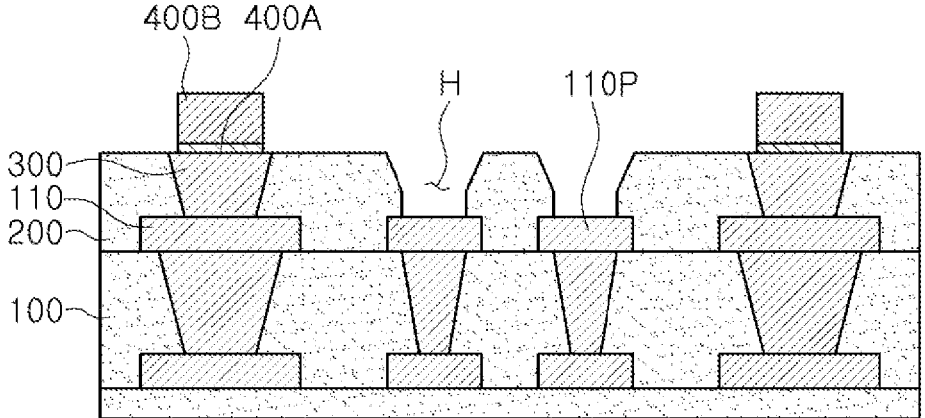

Thereafter, as illustrated in FIG. 6H, the electroless plating layer 400A may be partially removed. In this case, it is preferable to remove at least a portion of the electroless plating layer 400A through etching, but any known method such as peeling may be used. After removing at least a portion of the electroless plating layer 400A, the rest may correspond to the above-described metal post 400.

Figure 6I:
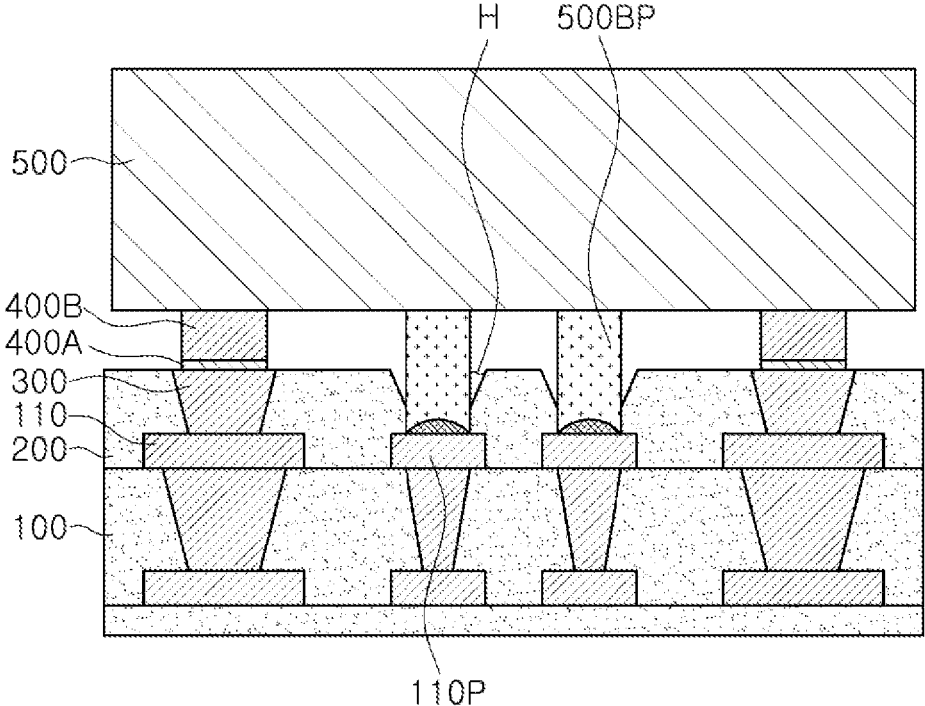

FIG. 6I illustrates a printed circuit board corresponding to the printed circuit board of FIG. 6H on which an electronic component 500 and a bump 500BP are disposed. While the printed circuit board of FIG. 6I is substantially similar to the printed circuit board in the exemplary embodiment of FIG. 5, the metal post 400 may include an electroless plating layer 400A and an electrolytic plating layer 400B, and the electronic component 500 may at least partially contact the electrolytic plating layer 400B, but the printed circuit board of FIG. 6I is not limited thereto.

Concerning the other components, what has been described above is substantially identically applicable, and thus, the detailed description thereof will not be repeated.

As set forth above, as one effect of the present disclosure, it is possible to provide a printed circuit board including a fine circuit and/or a fine via.

As another effect of the present disclosure, it is possible to provide a printed circuit board capable of effectively releasing heat generated by an electronic component.

While exemplary embodiments have been shown and described above, it will be apparent to those skilled in the art that modifications and variations could be made without departing from the scope of the present invention as defined by the appended claims.

What is claimed is:

1. A printed circuit board comprising:
   a first insulating layer;
   a first circuit layer disposed on one surface of the first insulating layer and including a connection pad;
   a second insulating layer disposed on the one surface of the first insulating layer in a stacking direction and embedding the first circuit layer;
   a via penetrating through the second insulating layer and connected to the first circuit layer;

a metal post disposed on one surface of the second insulating layer and connected to the via; and a hole penetrating through the second insulating layer and exposing a portion of the connection pad of the first circuit layer such that the second insulating layer overlaps another portion of the connection pad in the stacking direction, wherein the metal post is spaced apart from the hole, and protrudes from the second insulating layer.

2. The printed circuit board of claim 1, wherein the second insulating layer has a central portion and a peripheral portion, and the metal post is disposed on the peripheral portion of the second insulating layer.

3. The printed circuit board of claim 2, wherein the metal post extends along four surfaces of the peripheral portion of the second insulating layer.

4. The printed circuit board of claim 2, wherein the hole is disposed in the central portion of the second insulating layer.

5. The printed circuit board of claim 1, wherein a plurality of holes are arranged, and the metal post is disposed to surround the plurality of holes.

6. The printed circuit board of claim 1, wherein the via has a largest diameter in a region contacting the metal post.

7. The printed circuit board of claim 1, wherein in a direction crossing an extending direction of the metal post, the metal post has a dimension smaller than a largest dimension of the via.

8. The printed circuit board of claim 1, wherein the metal post includes an electroless plating layer and an electrolytic plating layer.

9. A printed circuit board comprising:

a first insulating layer;

a first circuit layer disposed on one surface of the first insulating layer and including a connection pad;

a second insulating layer disposed on the one surface of the first insulating layer and embedding the first circuit layer;

a via penetrating through the second insulating layer and connected to the first circuit layer;

a metal post connected to the via and protruding from the second insulating layer;

a hole penetrating through the second insulating layer and spaced apart from the metal post;

a bump disposed in the hole and connected to the connection pad of the first circuit layer; and an electronic component having one surface connected to each of the metal post and the bump.

10. The printed circuit board of claim 9, wherein the metal post is disposed on a peripheral portion of the electronic component.

11. The printed circuit board of claim 9, wherein the metal post has a height of 15 to 45 μm.

12. The printed circuit board of claim 9, wherein the metal post is configured to transfer heat generated by the electronic component.

13. The printed circuit board of claim 9, wherein the hole has a diameter equal to or larger than that of the bump.

14. The printed circuit board of claim 9, wherein the metal post includes copper (Cu).

15. The printed circuit board of claim 9, wherein at least a portion of a wall of the hole is spaced apart from the bump.

16. A printed circuit board comprising:

an insulating body;

a circuit layer embedded in the insulating body and including a connection pad;

a metal post protruding from the insulating body; and a hole penetrating in a region of the insulating body surrounded by the metal post to expose a portion of the connection pad.

17. The printed circuit board of claim 16, wherein the metal post includes a frame structure completely surrounding the hole.

18. The printed circuit board of claim 16, further comprising:

an electronic component connected to the connection pad through a bump disposed in the hole, and connected to the metal post.

19. The printed circuit board of claim 18, wherein a portion of the bump protrudes from the insulating body.

20. The printed circuit board of claim 18, wherein at least a portion of a wall of the hole is spaced apart from the bump.

21. The printed circuit board of claim 9, wherein the metal post protrudes from an uppermost surface of the second insulating layer.

* * * * *